United States Patent [19]
Schiller

[11] Patent Number: 5,591,300
[45] Date of Patent: Jan. 7, 1997

[54] SINGLE CRYSTAL SILICON DRY-ETCH ENDPOINT BASED ON DOPANT-DEPENDENT AND THERMALLY-ASSISTED ETCH RATES

[75] Inventor: Peter J. Schiller, Plymouth, Minn.

[73] Assignee: VTC Inc., Bloomington, Minn.

[21] Appl. No.: 484,020

[22] Filed: Jun. 7, 1995

[51] Int. Cl.$^6$ ............................ H01L 21/00; H05H 1/00; G01N 21/00

[52] U.S. Cl. ..................... 156/626.1; 156/628.1; 156/643.1

[58] Field of Search ................. 156/626.1, 628.1, 156/643.1

[56] References Cited

U.S. PATENT DOCUMENTS

| | | | |
|---|---|---|---|
| 4,356,055 | 10/1982 | Montier | 156/626.1 |
| 4,457,820 | 7/1984 | Bergeron et al. | 156/626.1 |
| 4,829,024 | 5/1989 | Klein et al. | 437/193 |
| 5,086,011 | 2/1992 | Shiota | 156/657.1 |
| 5,242,532 | 9/1993 | Cain | 156/626 |
| 5,308,414 | 5/1994 | O'Neill et al. | 156/626 |
| 5,312,515 | 5/1994 | Shinohara | 156/626 |
| 5,320,704 | 6/1994 | Horioka et al. | 156/626 |
| 5,322,590 | 6/1994 | Koshimizu | 156/626 |
| 5,392,124 | 2/1995 | Barbee et al. | 216/85 |
| 5,465,154 | 11/1995 | Levy | 156/626.1 |

FOREIGN PATENT DOCUMENTS

| | | | |
|---|---|---|---|
| 56-94759 | 7/1981 | Japan | 156/628.1 |
| 59-191333 | 10/1984 | Japan | 156/628.1 |

OTHER PUBLICATIONS

Barbee, S. G. et al "RIE Etch End–Point Detector For Variably Doped Silicon" IBM Technical Disclosure Bulletin vol. 24, No. 1B, p. 441 Jun. 1981.

Anonymous, "Etch Laser End Point Progress" Research Disclosure #30930 Jan. 1990.

*Primary Examiner*—R. Bruce Breneman
*Assistant Examiner*—Anita Alanko
*Attorney, Agent, or Firm*—Kinney & Lange, P.A.

[57] ABSTRACT

A dry etching method for endpoint detection of a single crystal silicon wafer is disclosed. A top portion of the single crystal silicon wafer is doped with heavy levels of a doping agent, thereby creating heavily and lightly doped regions within the single crystal silicon wafer. A photoresist is patterned on the top surface of the single crystal silicon wafer and etching commences on the top surface. The etch rate is monitored as the etch progresses through the top portion of the single crystal silicon wafer to determine the etch endpoint. The etch endpoint is detected by a local minimum generated by the combined effects of wafer surface thermal heating and the change or etch rate between the heavily doped single crystal silicon and lightly doped single crystal silicon. Once the etch endpoint has been detected, the etching process is stopped, and the photoresist is removed, thereby exposing a doped product.

15 Claims, 6 Drawing Sheets

SINGLE CRYSTAL SILICON DRY-ETCH ENDPOINT BASED ON DOPANT-DEPENDENT AND THERMALLY-ASSISTED ETCH RATES

BACKGROUND OF THE INVENTION

The present invention relates generally to an etching process for etching a semiconductor wafer, and more particularly to a process which co-relates etch depth directly with dopant diffusion depth of a doped single crystal silicon wafer.

In the manufacture of semi-conductor devices, dry etching is an indispensable process to the formation of IC patterns on a semi-conductor wafer. Dry etching is the removal of surface material from a wafer through use or a chemical process. Various types of dry etching are known. One method is a plasma etch process in which a thin film is placed on a semi-conductor wafer. A photoresist is placed on a segment of the semi-conductor wafer to protect the thin layer. The wafer is placed in a reaction chamber between a pair or, parallel plate electrodes. Reactant gasses and high RF power are introduced, generating a plasma. The plasma is applied to the semi-conductor wafer, thereby removing material from the top layer of the semi-conductor wafer not protected by the photoresist. The photoresist is removed, exposing the protected segment.

In order to determine when a semi-conductor device is at an ideal height for fabrication purposes, it is necessary to detect an etch endpoint. In a typical method or detecting the etch endpoint, a luminous intensity or plasma etching is monitored, and the endpoint of the plasma etching is determined from the change in the luminous intensity. If the etching process is continued after the material to be removed has been completely removed from the semi-conductor water, the surface of the wafer will be unnecessarily etched, resulting in a poor quality semi-conductor device. Therefore, it is essential that the endpoint of the etching process be detected with high accuracy.

One conventional method of etch endpoint detection normalizes the luminous intensity over a particular time period. An endpoint is detected when a signal level representing a current value of luminous intensity drops below a preset fraction of the normalized luminous intensity value. Normal values for the present fraction range from $1/10$ (10%) to $1/2$ (50%). Detection in this matter, therefore, requires a large and abrupt decrease in luminous intensity over successive time periods. Large and abrupt changes in luminous intensity are generally only possible when the thin film and the underlying semi-conductor wafer have significantly crystal structure and/or significantly different chemical compostions. If the crystal structure or chemical composition of the two materials are not significantly different, little or no change in luminous intensity will occur, resulting in an inconsistent etch end point detection.

Another conventional method of etch endpoint detection includes a single crystal semi-conductor wafer. This method is accomplished without the use of a thin film. Etching is performed in a similar manner and in a similar environment as in the thin film method. A photoresist is placed on a segment of the semi-conductor wafer. The semi-conductor wafer is placed in a reaction chamber between a pair of parallel plate electrodes. Reactant gasses and high RF power are introduced, generating a plasma. The plasma is applied to the semi-conductor wafer, thereby removing material from the top layer of the semi-conductor wafer not protected by the photoresist. The photoresist is removed, exposing the protected segment. In this method, however, the luminous intensity of the plasma etching does not significantly change as the etch progresses. Capturing large luminous intensity signal level drops is trade more difficult when a thin film is not used. The change in the material's chemical composition is less distinguishable, making the change in luminous intensity signal levels less distinguishable. The more dependent an etch is on ion bombardment, the less selective it will be between different materials. Thus, detecting an etch endpoint through on a single crystal wafer is more difficult. Low luminous intensity signal levels are inherent to single crystal etches. When accompanied by normal process variations and parameter drift, these low signal levels are virtually indistinguishable from noise. These low signal levels result, thus, in low repeatability. In this process, repeatability refers to the detection consistency of luminous intensity signal levels from wafer to wafer.

In summary, problems exist with both prior methods of dry etching. In the thin film method, the use of a thin film requires a substantial change in crystal structure and/or chemical composition of the underlying semi-conductor wafer. Also, detecting an endpoint based on normalized luminous intensities over time intervals requires abrupt signal level drops over successive time periods. This process produces inconsistent results and can result in etching further into the underlying semi-conductor wafer then desired, thereby reducing overall etch quality. In the single crystal method, low signal levels are inherent to the process, making the luminous intensity signal levels difficult to distinguish from noise. Because a single crystal method does not result in substantial changes of crystal structure or chemical composition, detecting a change in luminous intensity is inconsistent, resulting in low repeatability. The trade-off, therefore, is between signal level and overall etch quality. Higher signal levels can be achieved only at the expense of etch profile.

It is evident that there is a continuing need for an improved etch endpoint detection method for a single crystal silicon in modern IC processes. Conventional endpoint techniques are not adequate for a single crystal silicon wafer which requires both repeatably controlling single crystal silicon etches and maintaining etch quality. In particular, there is a need for high repeatability while maintaining high etch quality.

SUMMARY OF THE INVENTION

The present invention is an etch endpoint detection method for single crystal silicon which provides both high repeatability and maintains high etch quality.

The present invention provides an etching process in which a top region of a single crystal silicon wafer is doped with a doping agent such that the doping agent is applied to a top region of the single crystal silicon wafer to create a heavily doped top region and a lightly doped bottom region. A photoresist is then placed on a portion of the top surface of the single crystal silicon wafer. Etching commences on the exposed portion of the top region of the single crystal silicon wafer. The etch rate is monitored as the etch progresses through the top region of the single crystal silicon wafer towards the bottom region of the single crystal silicon wafer to determine the etch endpoint. The etch endpoint is determined by detecting a local minimum generated by the combined effects of wafer surface thermal heating and etch rate of the heavily doped top region of single crystal silicon. More particularly, the local minimum occurs at a point of minimum luminous intensity when the etch has progressed into the lightly doped region. The effects of surface thermal heating increase the overall luminous intensity, thereby defining the local minimum. The photoresist is lifted off, thereby exposing a doped segment.

DETAILED DESCRIPTION OF THE PREFERRED EMBODIMENTS

Figure 1A:
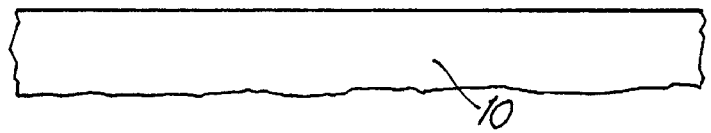
FIGS. 1A–1E are layer diagrams showing a prior art conventional etching process.
Figure 1B:
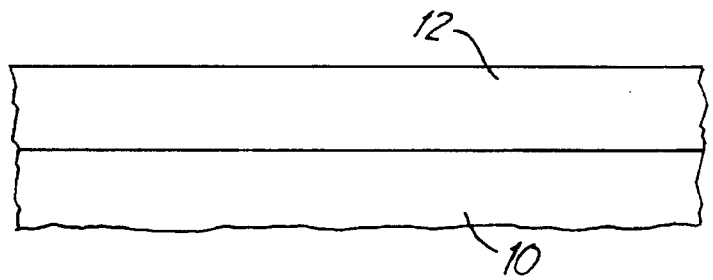
Figure 1C:
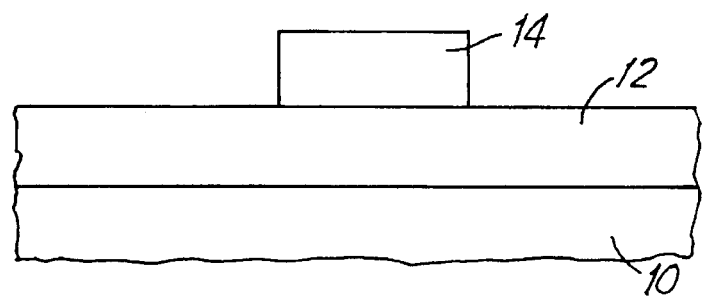
Figure 1D:
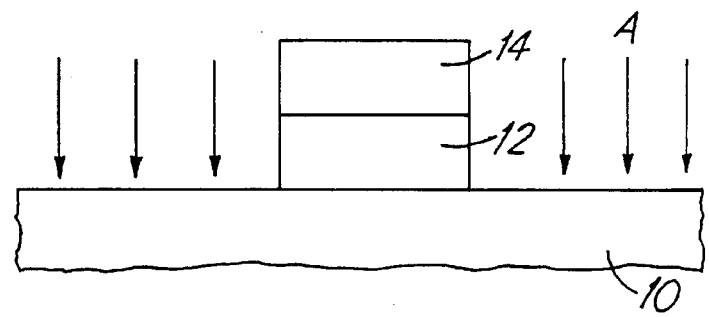
Figure 1E:
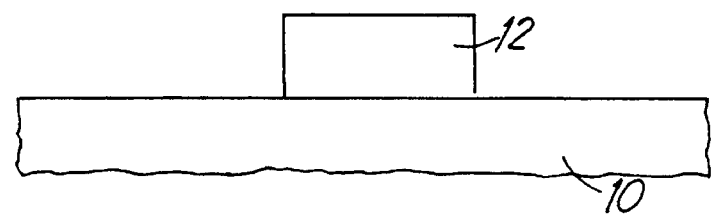
Figure 2:
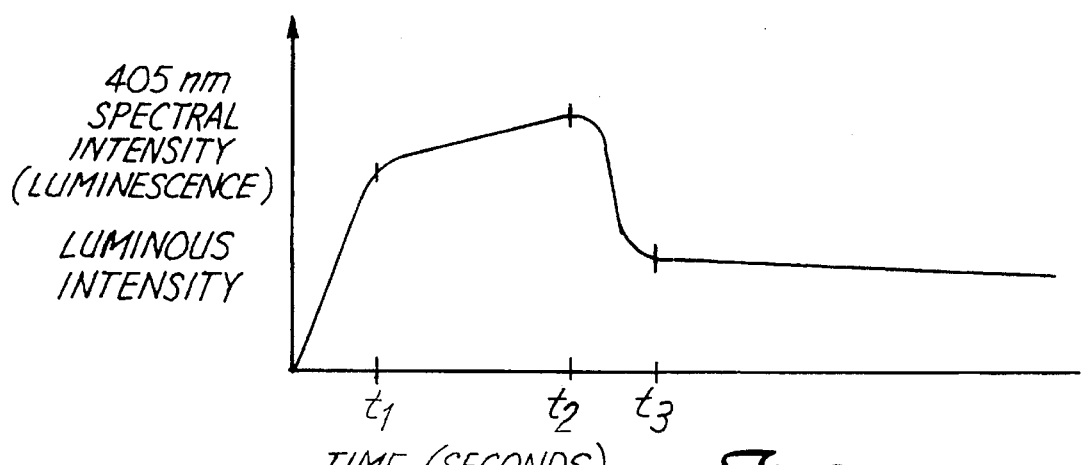
FIG. 2 is a graph illustrating time versus luminous intensity of the prior art etching process shown in FIG. 1.

The prior art relates to a conventional technique of an etching process shown in FIGS. 1 and 2 to perform etching of thin films on a single crystal silicon wafer. FIGS. 1A–1E are layer diagrams showing a conventional technique of the etching process. FIG. 1A is a layer diagram showing a single crystal silicon wafer 10. FIG. 1B is a layer diagram showing thin film 12 over wafer 10. Film 12 and wafer 10 can be many different substances. Common types of films and wafers include silicon nitride on top of single crystal silicon, silicon nitride on top of silicon dioxide, polycrystalline silicon on top of single crystal silicon, and silicon dioxide on top of single crystal silicon. FIG. 1C is a layer diagram showing a patterned photoresist 14 on film 12 on wafer 10. FIG. 1D is a layer diagram showing photoresist 14 in film 12 on wafer 10, illustrating the effects of etching the non-protected segment of film 12. Etching is shown by arrows A. FIG. 1E is a layer diagram showing exposed film 12 on wafer 10, after photoresist 14 has been removed through a lift-off process, illustrating lifting off of photoresist 14. FIG. 2 is a graph illustrating time versus spectral intensity in conjunction with a prior art process, illustrating endpoint detection using spectral characteristics for silicon dioxide over single crystal silicon.

In operation, film 12 is deposited on wafer 10, as shown in FIG. 1B. Photoresist 14 is then patterned on a segment of film 12, as shown in FIG. 1C. The wafer is then placed into a reaction chamber, between a pair of parallel plate electrodes. Etching commences by increasing RF power in the reaction chamber until stabilization at time T1, as shown in FIG. 2. Etching continues and the luminous intensity signal level increases due to the effects of surface thermal heating until a time T2. From time T2 to T3, the etch progresses through film 12 into wafer 10. As the etch crosses regions, the luminous intensity signal level drops from 10–50%, indicating that the etching has progressed through film 12 into wafer 10. This large signal level drop indicates the etch endpoint. Film 12 and wafer 10 have significant differences in chemical composition, atomic arrangement, or both. When film 12 completely etches through the exposed region not covered by photoresist 14, the large change in chemical composition or atomic arrangement results in large change in luminous intensity signal level The photoresist is then removed, exposing the protected segment, as shown in FIG. 1E.

Etch endpoint detection is typically time based. The luminous intensity signal level is normalized over a sample time period. Comparisons are made between luminous intensity values over successive time periods. An endpoint is detected when there is a large and abrupt decrease in the luminous intensity value between successive time samples. Maintaining high etch quality and repeatable endpoint detection is only possible when the chemical compostion or atomic arrangement changes significantly in the cross over region.

In another prior art method, dry etching is accomplished without the use of a thin film. Etching is performed directly in the top region of the single crystal wafer. Because compostion and crystal structure changes are small, however, low signal levels are inherent to single crystal etches. When accompanied by normal process variations and parameter drift, these low signal levels are virtually indistinguishable from the noise. The selectivity is not nearly as much as in the case of a thin film. The signal level is typically only two percent to three percent over normal noise. When the power supply and associated electronics are factored, the signal can be lost in the noise. Additionally, since composition and crystal structure changes are small, the luminous intensity value of the plasma etching does not significantly change as the etch progresses. When a thin film is used, the change in atomic arrangement or chemical composition accounts for the change in luminous intensity. In a single crystal semi-conductor wafer, however, there is no significant change in atomic arrangement or chemical composition. Thus, the luminous intensity value changes are very small. Because of these factors, detecting an etch endpoint in single crystals results in low repeatability.

Figure 3:
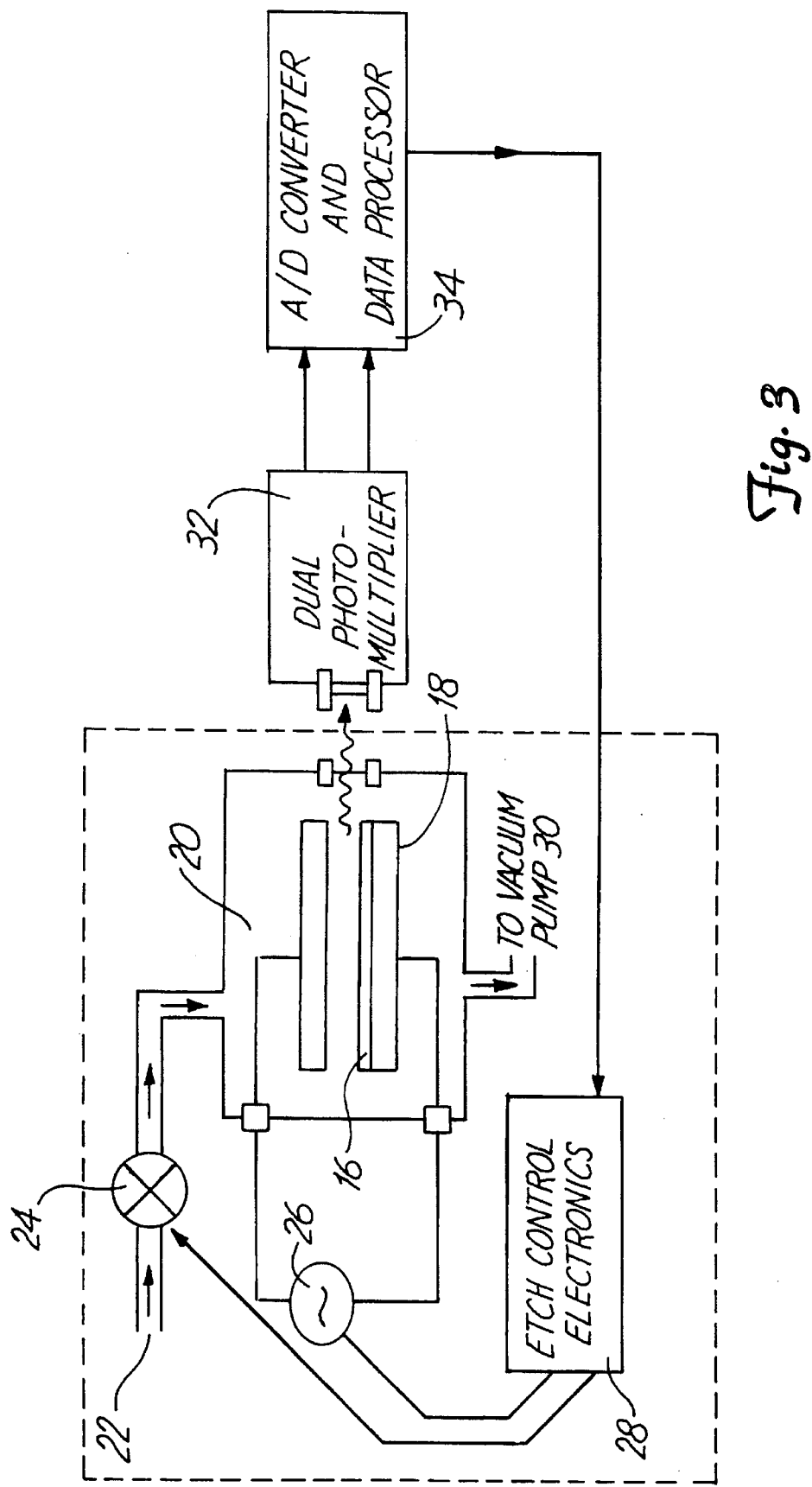
FIG. 3 is an overview of an etching process system, incorporating the present invention.

FIG. 3 is an overview of the etching process and system, according to the present invention. An ionized gas enhancing a dopant, such as arsenic, is applied to the top surface of single crystal silicon wafer 16 to heavily dope a top region of wafer 16. In a separate system, application of high temperatures diffuses the dopant to a controlled depth into wafer 16. Wafer 16 is placed between parallel plate electrodes 18 within etch chamber 20. RF power generator 26 applies a high energy potential across electrodes 18, generating an electromagnetic field that ionizes and oscillates the atoms in a vertical direction, thereby providing ion bombardment into the top surface of wafer 16. Etching gasses 22, such as $CF_4$, flow through gas flow controller 24 and are introduced into etch chamber 20. The combination of RF power reacting with gasses 22, generating a plasma that causes the dry etching process. Vacuum pump 30 pulls all the by-products and gasses out of the chamber. Optical emission exits etch chamber 20 and enters dual photo multiplier 32. Multiplier 32 filters out all but the luminous intensity of interest and converts the intensity into a corresponding voltage. The voltage is provided to analog to digital converter 34 and converted to digital data sent to etch control electronics 28. Etch control electronics 28 processes the signal to control the power to generator 26 and controller 24. When an endpoint is detected, etch control electronics 28 sends a control signal to generator 26 and controller 24 to shut off power and etching gases, thereby stopping the etch process.

Figure 4A:
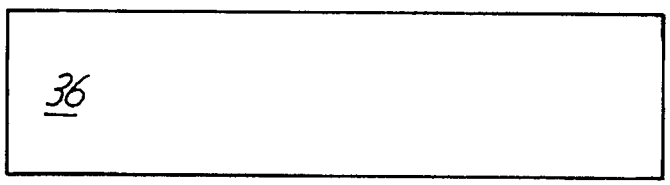
FIGS. 4A–4G are layer diagrams showing a single crystal silicon etching process, according to the present invention.
Figure 4B:
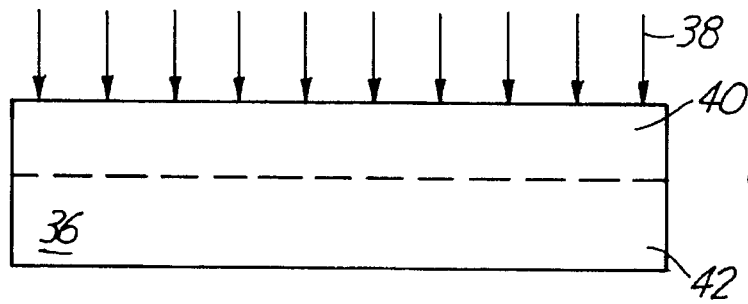
Figure 4C:
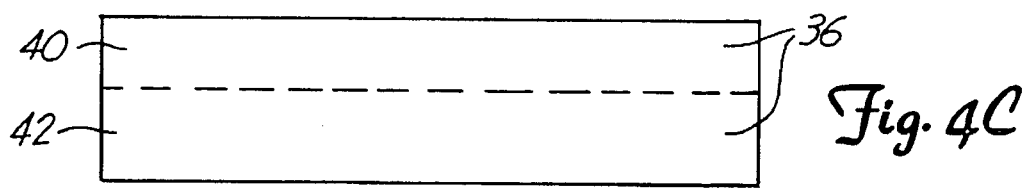

FIGS. 4A–4G are layer diagrams showing the etching process according to the present invention. FIG. 4A is a layer diagram showing a lightly doped single crystal silicon wafer 36. FIG. 4B is a layer diagram showing doping agent implant 38 of the top surface of wafer 36. An ionized gas containing, the doping agent is accelerated through an electromagnetic field, penetrating the top surface of wafer 36. FIG. 4C is a layer diagram showing wafer 36, having heavily doped region 40 and lightly doped region 42. Heavily doped region 40 is created by a large concentration of doping agent along top surface 36A of wafer 36, as a result of the implant process. Lightly doped region 42 is created by a small concentration of the doping agent, covering the bottom region of the single crystal semi-conductor wafer. Both regions are created within the single crystal 36. The concentration of doping agent decreases as the distance increases from top surface 36A of wafer 36. The doping concentration remains fairly constant through heavily doped region 40, and the concentration sharply decreases in lightly doped region 42.

Figure 4D:
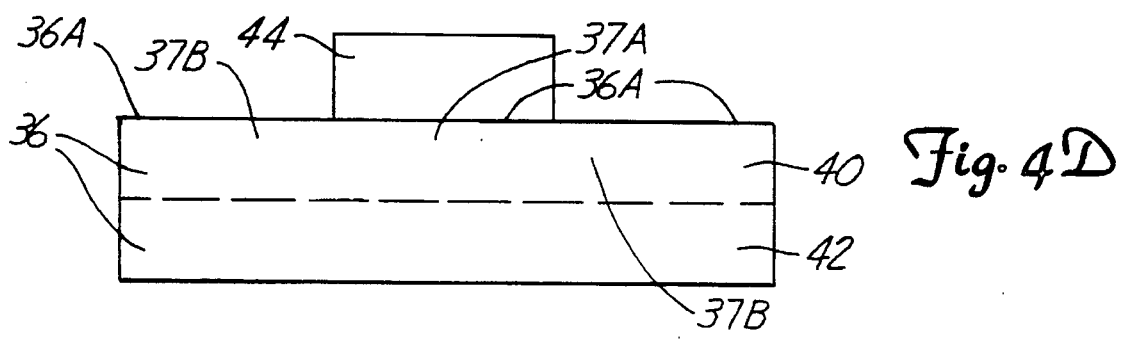

FIG. 4D is a layer diagram showing photoresist 44 patterned on wafer 36. The photoresist acts as a protectant of non-exposed portion 37A of the top segment of wafer 36, protecting that portion of the wafer from being etched.

Figure 4E:
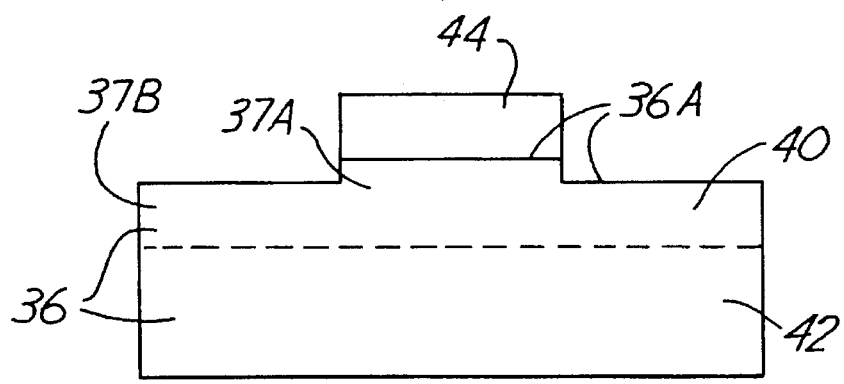

FIG. 4E is a layer diagram showing the effects of etching exposed portion 37B of the top surface of heavily doped region 40. Etching occurs on heavily doped region 40. As etching continues, the etch progresses deeper through non-protected portions 37B of heavily doped region 40.

Figure 4F:
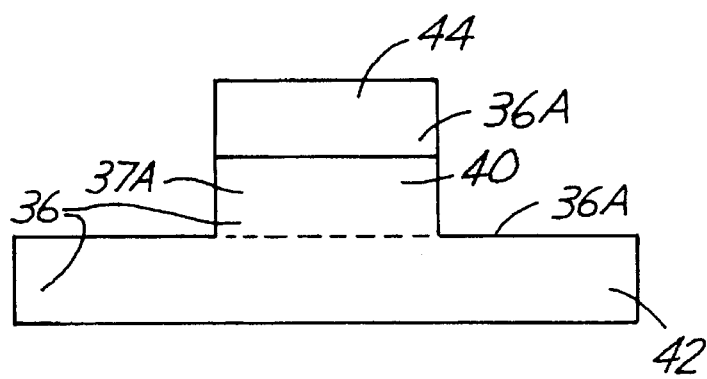

FIG. 4F is a layer diagram further illustrating the effects of etching exposed portion 37B of heavily doped region 40 of wafer 36, as the etch has progressed to the boundary between heavily doped region 40 and lightly doped regions 42. The etch rate decreases as the etch progresses into lower concentration regions.

Figure 4G:
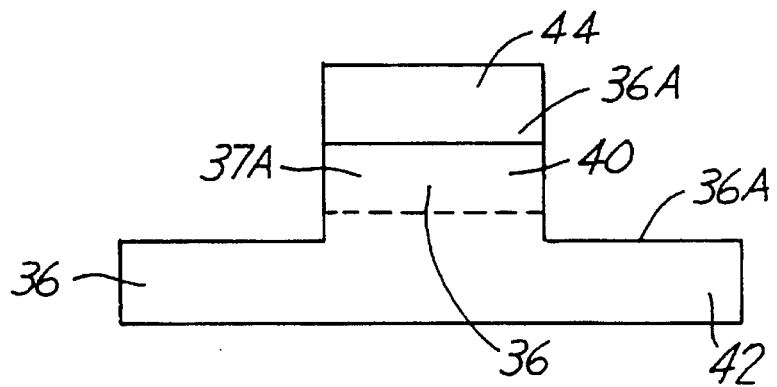

FIG. 4G is a layer diagram illustrating the etch penetrating lightly doped region 42 of wafer 36. At this point, the etch rate is at a minimum, since the etch has progressed to the low concentration region of wafer 36. The etch endpoint is detected, and the etching process stops.

In one preferred embodiment, wafer 36 is approximately 1 mm thick. The doping agent applied to the top surface wafer 36 is arsenic, which creates heavily doped region 40 and lightly doped region 42 within wafer 36. The heavily doped region is between 0.03 µm and 0.04 µm deep from the top surface of wafer 36. A preferred depth is 0.035 µm. Heavily doped region has an atomic concentration of arsenic between 0.1% and 2.0%. A preferred atomic concentration is about 0.5%. High temperatures are applied, diffusing the arsenic to a controlled depth within wafer 36. The lightly doped region has an atomic concentration of arsenic between 0.00001% and 0.001%. A preferred atomic concentration is about 0.0001%. This atomic concentration level remains relatively constant throughout heavily doped region 40 and drops off sharply upon entering lightly doped region 42 of the wafer 36. The boundary between heavily doped region 40 and lightly doped region 42 is between 0.10 µm and 0.50 µm from the top surface of the wafer. A preferred depth is about 0.25 µm. When the etch progresses below the boundary, the etch has entered lightly doped region 42 and a local minimum is detected according to the present invention.

Figure 5:
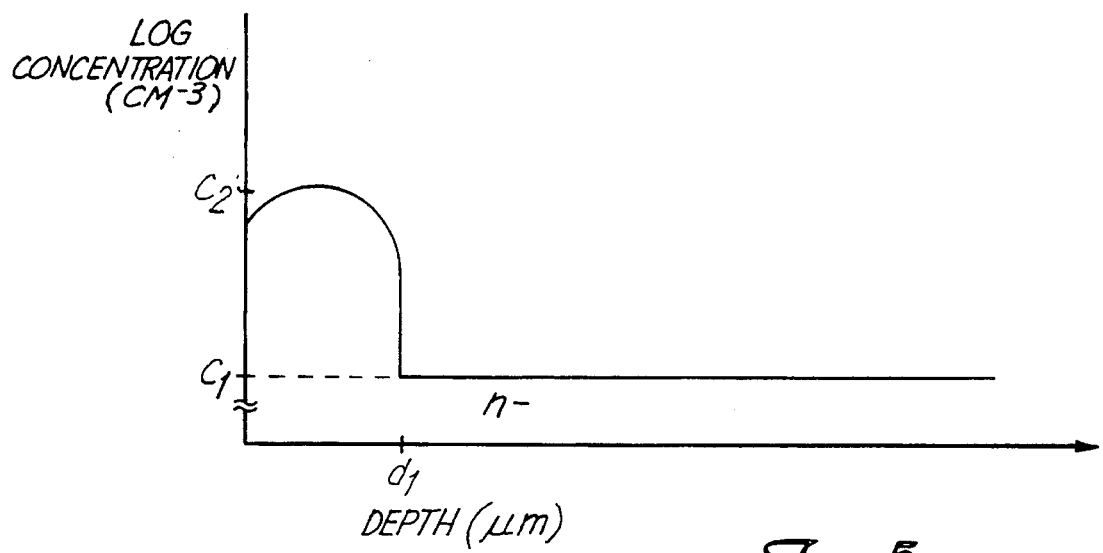
FIG. 5 is a graph illustrating depth of a silicon wafer versus concentration of a doping agent, according to the present invention.

FIG. 5 is a graph illustrating depth of wafer 36 versus concentration of a doping agent, according to the present invention. As the etch progresses through heavily doped region 40, the luminous intensity measured decreases relative to the doping concentration. That is, as the doping concentration decreases, the luminous intensity signal level decreases. When the etch progresses into the lightly doped region, the luminous intensity drops to a relatively low, constant level.

In one preferred embodiment, the concentration of arsenic ions in the heavily doped region 40 is between $5 \times 10^{19}$ cm$^{-3}$ and $1 \times 10^{21}$ cm$^{-3}$. A preferred concentration is about $2 \times 10^{20}$ cm$^{-3}$. The concentration is relatively constant to a depth between 0.10 µm and 0.35 µm from the top surface. A preferred depth is about 0.20 µm. At this point, the concentration level sharply reduces to a concentration minimum of between $1 \times 10^{15}$ cm$^{-3}$ and $1 \times 10^{17}$ cm$^{-3}$, which occurs between 0.10 µm and 0.35 µm. It is preferred that the concentration level sharply roll off at a concentration minimum of $1 \times 10^{16}$ cm$^{-3}$, occurring at a depth of about 0.25 µm.

Figure 6:
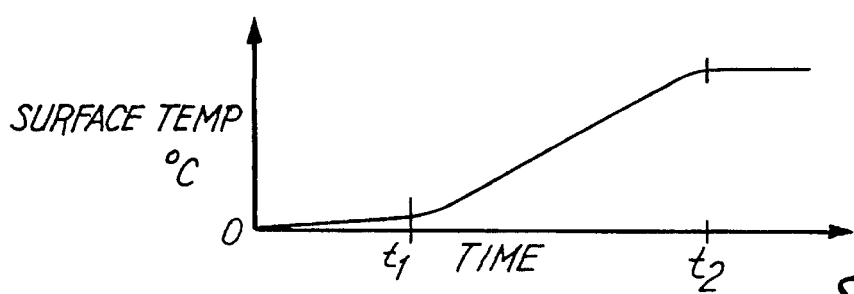
FIG. 6 is a graph illustrating time versus surface temperature, according to the present invention.

FIG. 6 is a graph illustrating time versus surface temperature of wafer 36, according to the present invention. Thermal heating occurs throughout the etching process previously discussed, contributing to the luminous intensity signal level. Initially, the signal level as a result of surface thermal heating at surface 36A is low. As the RF power generator increases power dissipation, the thermal heating component of the luminous intensity signal level steadily increases. Eventually, the surface temperature reaches an equilibrium.

In one preferred embodiment, surface thermal heating is relatively slow for the first three to eight seconds. A preferred time is five seconds. Surface thermal heating then steadily increases until thirty to ninety seconds. A preferred time is sixty seconds. At this point, surface temperature reaches an equilibrium, and the luminous intensity signal level remains relatively constant.

Figure 7:
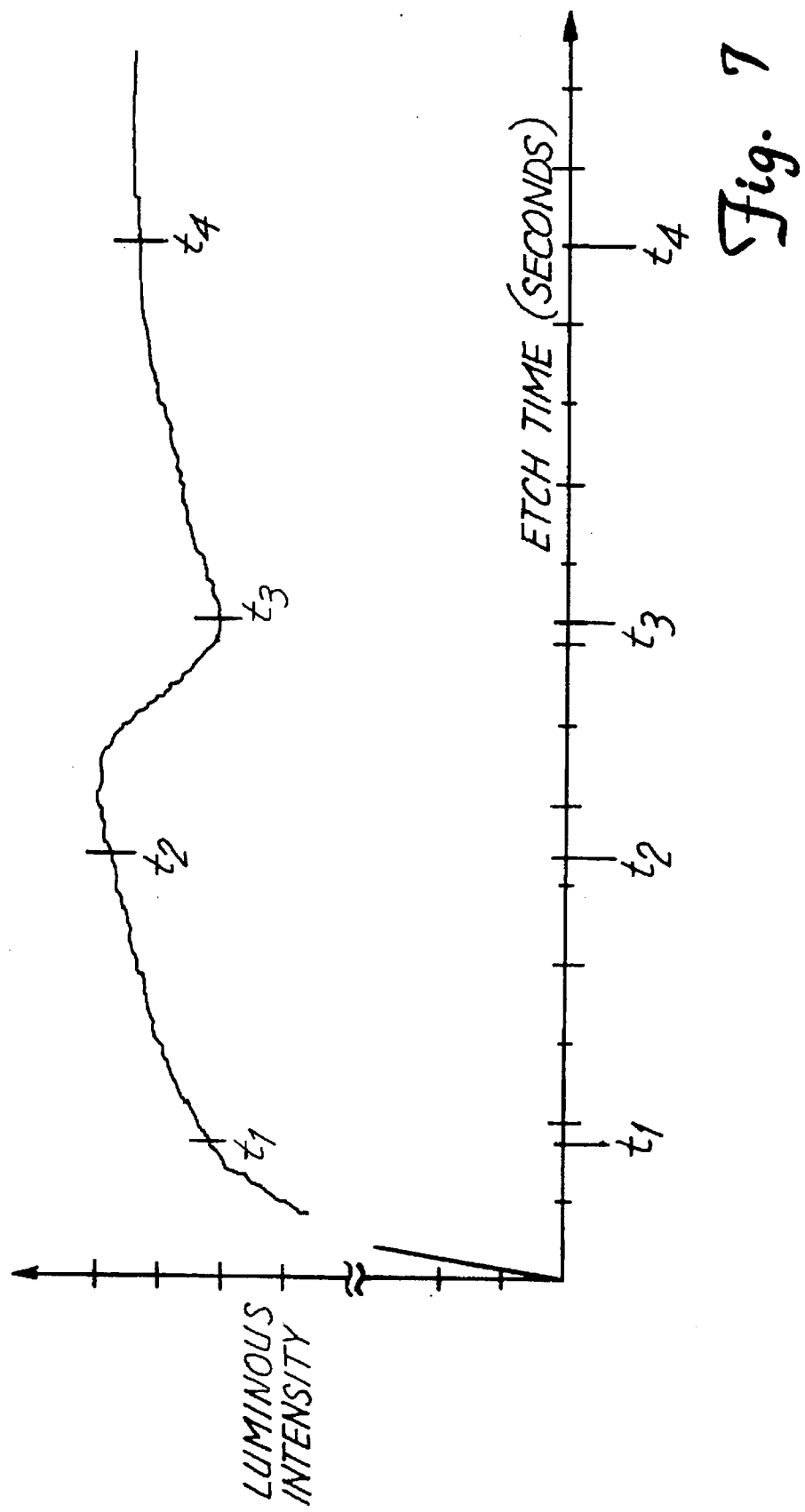
FIG. 7 is a graph illustrating etch time versus luminous intensity, according to the present invention.

The separate effects illustrated in FIGS. 5 and 6 are monitored together, resulting in the graph shown in FIG. 7. In essence, FIG. 7 is a result of the combined effects of FIGS. 5 and 6. In FIG. 7, the luminous intensity increases as the etch progresses through heavily doped region 42 of the wafer 36 until a time T1. From time T1 to T2, the luminous intensity increases due to the effects of etching through heavily doped region 40 of wafer 36 and the effects of surface thermal heating at surface 36A. At time T2, the etch rate slows down as the etch progresses into lightly doped region 42 of wafer 36. The slowing etch rate decreases the luminous intensity due to etch rate. Surface thermal heating at surface 36A still occurs during this time, but, the luminous intensity is dominated by the decreasing, etch rate until a relative minimum luminous intensity at time T3 is realized. The net effect of decreasing the etch rate and increasing surface thermal heating results in a decreasing luminous intensity. At time T3 the etch is in lightly doped region 42, resulting in a relatively constant luminous intensity component due to etch rate. Surface temperature, however, is still increasing at a steady rate. Thus, the resulting luminous intensity increases from the minimum intensity at T3. Between time T3 to T4, the luminous intensity is dominated by the effects of surface thermal heating at surface 36A. After time T4, both the surface temperature and etch rate remain relatively constant, resulting in a constant luminous intensity.

In one preferred embodiment, a luminous intensity of a wavelength of 405 nm is monitored during etching of heavily arsenic doped single crystal silicon wafer 36. The luminous intensity sharply increases for approximately the first 10 seconds of etching, to a normalized luminous intensity level of 0.97. The normalized signal level is determined by comparison to luminous intensity signal levels of a 520 nm wavelength. As the etch progresses from approximately 10 to 25 seconds, surface thermal heating drives the normalized luminous intensity higher, to approximately 0.99. This corresponds to the graph shown in FIG. 7 between times T1 and T2, and to FIG. 4E. As the etch progresses from approximately 25 to 40 seconds, the normalized luminous intensity decreases from 0.99 to 0.98. This drop is caused by the decrease in luminous intensity due to the decrease in etch rate as the etch progresses from heavily doped region 40 to lightly doped region 42. This corresponds to the graph shown in FIG. 7 between times T2 and T3, and FIG. 4F. At approximately 45 seconds, the luminous intensity again begins to increase, signifying the local minimum point increases from approximately 0.98 to 0.99. This is largely due to the effects of surface thermal heating at surface 36A. At this point, the effects of etching on the change in luminous intensity are negligible. Since the etch has entered lightly doped region 42, the etch rate is fairly constant. The increase in luminous intensity between times T3 and T4 is mainly due to the effects of the surface thermal heating. As the etch time increases beyond 65 seconds, the normalized luminous intensity stays relatively constant at approximately 0.99. Here, the increase in surface thermal heating has saturated. Since the etch is now completely in lightly doped region 42 and the surface temperature is no longer increasing, the luminous intensity remains constant. This corresponds to the graph of FIG. 7 beyond time T4.

Referring to FIG. 7, the etch endpoint is detected at the local minimum at time T3. This luminous intensity minimum corresponds to all etch depth at which the etch rate has ceased to decrease; i.e., the boundary between the heavily doped region and the lightly doped region. The luminous intensity signal minimum repeatedly occurs when the etch rate reaches the boundary between heavy and light doping concentrations.

By utilizing the effects of the thermal heating component on the luminous intensity signal combined with the effects of etch rate on the luminous intensity signal, etch endpoint detection is less dependent on the strength of the luminous intensity signal level. Detection by this manner is also independent of time-based sampling requiring large, successive signal level changes. There is no tradeoff between repeatability and etch quality. Thus. characteristics such as uniformity, line width control, anisotropy, and surface roughness can be optimized.

Although the present invention has been described with reference to preferred embodiments, workers skilled in the art will recognize that changes may be made in form and detail without departing from the spirit and scope of the invention.

What is claimed is:

1. A process for detecting an endpoint in a dry etch process comprising:
    monitoring the combination of a decreasing etch rate and an increasing surface thermal heating as the etch progresses between a heavily doped region of a single crystal silicon wafer and a lightly doped region of the single crystal silicon wafer; and
    detecting a local minima of the effects of the decreasing etch rate and increasing surface thermal heating.

2. The method of claim 1, where the atomic concentration of he dotting agent in the heavily doped region of the single crystal silicon wafer is 0.5%.

3. The method of claim 1, where the atomic concentration of the doping agent in the lightly doped region of the single crystal silicon wafer is less than 0.01%.

4. The method of claim 1, where the doping agent is arsenic.

5. The method of claim 1, where the local minima is determined by a decreasing luminous intensity due to a decreasing etch rate and an increasing luminous intensity due to an increase in wafer surface thermal heating.

6. A dry etching process for forming a semi-conductor device comprising:
    doping a top region of a single crystal silicon wafer with a doping agent such that the doping agent is interdispersed throughout a top portion of the single crystal silicon wafer, thereby forming a heavily doped top region and a lightly doped bottom region;
    placing a photoresist on a portion of a top surface of the single crystal silicon wafer to protect a portion of the top surface and to expose a portion of the top surface;
    etching the exposed portion of the top region of the single crystal silicon wafer;
    detecting a local luminous intensity minimum through use of a combination of wafer surface thermal heating and a change of etch rate between the heavily doped top region and the lightly doped bottom region;
    stopping the etching of the single crystal silicon wafer when the local minimum has been detected; and
    lifting off the photoresist, thereby exposing a doped segment of the single crystal silicon wafer.

7. The method of claim 6, where the top region of the single crystal silicon wafer is heavily doped with the doping agent at an atomic concentration in the range of 0.1% to 2.0%.

8. The method of claim 6, where the bottom region of the single crystal silicon wafer contains the doping agent at an atomic concentration of less than 0.01%.

9. The method of claim 6, where the doping agent is arsenic.

10. The method of claim 6, further comprising:
    placing the single crystal silicon wafer within a reaction chamber prior to doping; and
    generating plasma in the reaction chamber after the photoresist has been placed on the portion of the top surface of the single crystal silicon wafer, thereby etching the exposed portion of the single crystal silicon wafer.

11. A dry etching process for forming a semi-conductor device comprising:
    doping a top region of a single crystal silicon wafer with a doping agent such that the doping agent is interdispersed throughout a top portion of the single crystal silicon wafer, thereby forming a heavily doped top region and a lightly doped bottom region;
    placing a photoresist on a portion of a top surface of the single crystal silicon wafer to protect a portion of the top surface and to expose a portion of the top surface;
    etching the exposed portion of the top region of the single crystal silicon wafer;
    detecting a local minimum through use of a combination of a decreasing luminous intensity due to a decreasing etch rate and an increasing luminous intensity due to an increase in wafer surface thermal heating;
    stopping the etching of the single crystal silicon wafer when the local minimum has been detected; and
    lifting off the photoresist, thereby exposing a doped segment of the single crystal silicon wafer.

12. The method of claim 11, where the top region of the single crystal silicon wafer is heavily doped with the doping agent at an atomic concentration in the range of 0.1% and 2.0%.

13. The method of claim 11, where the bottom region of the single crystal silicon wafer contains the doping agent at an atomic concentration of less than 0.01%.

14. The method of claim 11, where the doping agent is arsenic.

15. The method of claim 11, further comprising:

placing the single crystal silicon wafer within a reaction chamber prior to doping; and generating plasma in the reaction chamber after the photoresist has been placed on the portion of the top surface of the single crystal silicon wafer, thereby etching the exposed portion of the single crystal silicon wafer.

* * * * *

UNITED STATES PATENT AND TRADEMARK OFFICE
CERTIFICATE OF CORRECTION

PATENT NO. : 5,591,300
DATED : JANUARY 7, 1997
INVENTOR(S) : PETER A. SCHILLER

It is certified that error appears in the above-indentified patent and that said Letters Patent is hereby corrected as shown below:

Col. 1, line 23, delete "or,", insert --of--

Col. 1, line 32, delete "or", insert --of--

Col. 2, line 6, delete "trade", insert --made--

Col. 4, line 5, after "level", insert --.--

Col. 5, line 6, after "containing", delete ","

Col. 6, line 47, after "decreasing", delete ","

Col. 7, line 30, delete "all", insert --an--

Col. 7, line 43, after "Thus", delete ".", insert --,--

Col. 7, line 62, delete "he dotting", insert --the doping--

Signed and Sealed this

Seventeenth Day of June, 1997

Attest:

BRUCE LEHMAN

*Attesting Officer*    *Commissioner of Patents and Trademarks*